(12) United States Patent
Kim et al.

(10) Patent No.: US 6,747,254 B2
(45) Date of Patent: Jun. 8, 2004

(54) APPARATUSES FOR HEAT-TREATMENT OF SEMICONDUCTOR FILMS UNDER LOW TEMPERATURE

(75) Inventors: Hyoung June Kim, Anyang (KR); Dong Hoon Shin, Seoul (KR)

(73) Assignee: Viatron Technologies Inc., Seoul (KR)

( * ) Notice: Subject to any disclaimer, the term of this patent is extended or adjusted under 35 U.S.C. 154(b) by 60 days.

(21) Appl. No.: 10/146,504

(22) Filed: May 14, 2002

(65) Prior Publication Data

US 2003/0197007 A1 Oct. 23, 2003

(30) Foreign Application Priority Data

Apr. 19, 2002 (KR) .......................... 2002-21503

(51) Int. Cl.[7] ................................ H05B 6/10
(52) U.S. Cl. ...................... 219/635; 219/634
(58) Field of Search .................. 219/635, 638, 219/634; 118/723 I, 723 IR, 730, 715, 725; 117/94, 95; 438/487, 488, 495, 501, 502, 505; 156/345.42, 345.46, 345.38, 345.49

(56) References Cited

U.S. PATENT DOCUMENTS 3,658,585 A * 4/1972 Folkmann et al. .......... 438/566
5,578,521 A * 11/1996 Suzuki et al. .............. 117/94
2003/0010775 A1 * 1/2003 Kim ........................ 219/634

OTHER PUBLICATIONS

Sze, S.M., *VLSI Technology*, Second Edition, McGraw–Hill Book Company, pp. 286–299 (1988).

Cullity, B.D., *Introduction to Magnetic Materials*, Addison–Wesley Publishing Company, pp. 12–18 and pp. 34–37 (1972).

* cited by examiner

*Primary Examiner*—Quang T. Van
(74) *Attorney, Agent, or Firm*—Ladas & Parry

(57) ABSTRACT

The present invention relates to apparatuses for continuous and efficient heat-treatment of semiconductor films upon thermally susceptible non-conducting substrates at a minimum thermal budget, and more particularly, to a polycrystalline silicon thin-film transistors (poly-Si TFTs) and PN diodes on glass substrates for various applications of liquid crystal displays (LCDs), organic light emitting diodes (OLEDs), and solar cells. According to the apparatuses of the present invention, the semiconductor films can be heat-treated without damaging the thermally susceptible substrates: e.g., crystallization of amorphous silicon films at the minimum thermal budget acceptable for the use of glass, enhancing kinetics of dopant activation at the minimum thermal budget acceptable for the use of glass.

11 Claims, 14 Drawing Sheets

APPARATUSES FOR HEAT-TREATMENT OF SEMICONDUCTOR FILMS UNDER LOW TEMPERATURE

FIELD OF THE INVENTION

The present invention relates to apparatuses for continuous and efficient heat-treatment of semiconductor films upon thermally susceptible non-conducting substrates at a minimum thermal budget. More particularly, the invention relates to apparatuses for heat-treatment of preparing polycrystalline silicon thin-film transistors (poly-Si TFTs) and PN diodes on glass substrates for various applications of liquid crystal displays (LCDs), organic light emitting diodes (OLEDs), and solar cells.

BACKGROUND OF THE INVENTION

Liquid crystal displays (LCDs) and organic light emitting diodes (OLEDs) grow rapidly in the flat panel displays. In the present time, those display systems employ the active matrix circuit configuration using thin film transistors (TFTs). Fabrication of the TFTs on glass substrate is necessary in those applications.

TFT-LCDs typically uses the TFTs composing amorphous Si films as an active layer (i.e., a-Si TFT LCD). Recently, interests on the development of TFTs using polycrystalline silicon films instead of amorphous silicon films (i.e., poly-Si TFT LCD) is spurred because of their superior image resolution and merit of simultaneous integration of pixel area with peripheral drive circuits. In the area of OLEDs, uses of poly-Si TFTs provide evident advantages over a-Si TFTs, since the current derivability of poly-Si TFTs are substantially higher than that of a-Si TFTs, thus, leading to a higher operation performance.

The most formidable task for the fabrication of poly-Si devices on the commercially available glass substrates is a development of heat-treatment method that the glass substrate withstands at a minimum thermal budget. Glass is easily deformed when exposed to the temperature above 600° C. for substantial length of time. The important heat-treatment steps that require high thermal budget for the fabrication of poly-Si devices include crystallization of amorphous Si films and electrical activation of implanted dopants for P (or N)-type junction. Those heat-treatments typically require high thermal budgets, unavoidably causing damage or distortion of glass.

Various methods for solving those problems have been developed. Those methods will be briefly reviewed with distinguishing areas of crystallization of amorphous Si and dopant activation.

(1) Heat-Treatments for Crystallization of Amorphous Si into Polycrystalline Si

A poly-Si film is typically obtained through deposition of an amorphous Si film by chemical vapor deposition method (CVD) and subsequent post-deposition crystallization heat-treatments.

Solid phase crystallization (SPC) is a popular method for crystallizing amorphous silicon. In this process, the amorphous silicon is subject to heat-treatments at temperatures approaching 600° C. for a period of at least several hours. Typically, glass substrates are processed in a furnace having a resistive heater source. However, high thermal budget of this method leads to damage and/or distortion of used glass substrates.

Various crystallization methods exist for converting amorphous Si into polycrystalline Si at low temperatures without damaging glass. Important methods for this are excimer laser crystallization (ELC) and metal-induced crystallization (MIC).

The ELC method utilizes the nano-second laser pulse to melt and solidify the amorphous silicon into a crystalline form. However, this method has critical drawbacks for its use in mass production. The grain structure of poly-Si film through this process is extremely sensitive to the laser beam energy, so that the uniformity in grain structure and hence the device characteristics cannot be achieved. Also, the beam size of the laser is relatively small. The small beam size requires multiple laser passes or shots to complete the crystallization processes for large size glass. Since it is difficult to precisely control the laser, the multiple shots introduce non-uniformities into the crystallization process. Further, the surface of ELC poly-Si films is rough, which also degrades the performance of device. The ELC also has the problem of hydrogen eruption when deposited amorphous Si has high hydrogen contents, which is usually the case in the plasma enhanced chemical vapor deposition (PECVD). In order to prevent the hydrogen eruption, the heat-treatment for dehydrogenation should be required at high temperature (450~480° C.) for long period (>2 hrs). In addition to the problems in the area of processes, the system of ELC process equipment is complicated, expensive, and hard to be maintained.

The MIC process involves addition of various metal elements such as Ni, Pd, Au, Ag, and Cu onto amorphous Si films in order to enhance the crystallization kinetics. Use of this method enhances the crystallization at low temperatures below 600° C. This method, however, is limited by poor crystalline quality of poly-Si and metal contamination. The metal contamination causes a detrimental leakage current in the operation of poly-Si TFTs. Another problem of this method is a formation of metal silicides during the process. The presence of metal silicides leads to an undesirable residue problem during the following etching process step.

(2) Heat-Treatments for Dopant Activations

In addition to crystallization process, another heat-treatment process with high thermal budget is the dopant activation anneals. In order to form n type (or p type) regions such as source and drain regions of TFTs, dopants such as arsenic, phosphorus, or boron are implanted into Si films using ion implantation or plasma doping method. After doping of dopants, silicon is annealed for electrical activation (activation anneals). Similarly to a heat-treatment of crystallization, annealing is normally carried out in the furnace with a resistance heater source. This process requires high temperatures near 600° C. and long duration time. Therefore, a new method for reducing thermal budget is needed and presented in the prior art. The excimer laser anneals (ELA) and rapid thermal anneals (RTA) are presented for those purposes.

The ELA uses the identical process mechanism with that of the ELC, that is, rapid re-melting and solidification of poly-Si with nano-second laser pulse. The problem which was found in the ELC for crystallization also exists here. The rapid thermal changes during the ELC process leads to an introduction of high thermal stress to the poly-Si films as well as the glass, and hence, the deterioration of device reliability.

The RTA method uses higher temperature but for short duration of time. Typically, the substrate is subjected to temperature approaching 700~1000° C. during the RTA, however, the annealing process occurs relatively quickly, in minutes or seconds. Optical heating sources such as tungsten-halogen or Xe Arc lamps are often used as the RTA heat source. The problem of the RTA is that the photon radiation from those optical sources has the range of wavelength in which not only the silicon film but also the glass substrate is heated. Therefore, the glass is heated and damaged during the process.

Based upon the prior art, it is of great interest to develop apparatuses for enhancing the kinetics of crystallization and dopant activations for device fabrication on glass, and also to reduce the thermal budget required for those processes.

SUMMARY OF INVENTION

Accordingly, the objectives of the present invention are to solve the problems described above for once and all.

The present invention provides apparatuses for continuous and efficient heat-treatment of semiconductor films upon thermally susceptible non-conducting substrates at a minimum thermal budget. That is, the apparatuses for heat-treating the semiconductor films upon the thermally susceptible non-conducting substrates comprise:

(a) induction coils continuously forming an upper layer and a lower layer in such a way that the electromagnetic force can be generated parallel to the in-plane direction of semiconductor films, wherein materials consisting of thermally susceptible non-conducting substrates and semiconductor films deposited thereon (so called, "heat-treatment materials") can be moved into the space between said upper layer and said lower layer;

(b) magnetic cores covering the external surfaces of said upper layer and said lower layer, respectively; and, (c) preheating member heating the heat-treatment materials for preparation of induction-heat prior to its movement into the space between said upper layer and said lower layer, wherein the semiconductor films of the heat-treatment materials is heated to the extent that said semiconductor films can be induction-heated at the minimum thermal budget acceptable for the use of substrates.

Representative examples of said semiconductor films are silicon films being amorphous silicon films or crystalline silicon films, and representative examples of said thermally susceptible non-conducting substrates are glass and plastic substrates.

According to the apparatuses of the present invention, the semiconductor films can be heat-treated continuously and efficiently without damaging the thermally susceptible substrates: e.g., crystallization of amorphous silicon films at the minimum thermal budget acceptable for the use of glass, enhancing kinetics of dopant activation at the minimum thermal budget acceptable for the use of glass.

Said silicon films of the heat-treatment materials are deposited on the glass substrate, in the form of either amorphous state crystallizing into polycrystalline in the case of crystallization heat-treatment, or polycrystalline state implanted by dopants (n or p type) in the case of dopant activation heat-treatment.

Said induction coils generate alternating magnetic flux on the semiconductor films by high frequency current applied thereto, thereby heating the semiconductor films.

In the configuration of forming the upper and lower layer with the induction coils, one of preferable examples is that the induction coil starting at an upper end is wound in the planar form by one or more than two rounds and then turns back to that upper end to form the upper layer, and subsequently the induction coil starting at a lower end corresponding to the upper end is wound in the planar form by one or more than two rounds and then turns back to that lower end to form the lower layer. In the upper and lower layers, winding directions and round numbers of the induction coil are the same with each other. Therefore, the alternating magnetic flux can be uniformly collimated in the direction perpendicular to the semiconductor films. The upper end being a starting point for forming the upper layer is located in the identical direction with the lower end being a starting point for forming the lower layer. Furthermore, when the induction coil which has formed the upper layer shifts to the starting point for forming the lower layer, the portion connecting both layers becomes to protrude sideways so as to prevent the contact of the induction coil itself. Accordingly, in the view of whole configuration, the upper and lower layers are separated from each other; however, both layers are connected at the side that the induction coil starts, but they are separated at the opposite side.

Preferably, in order to prevent overheating of the induction coils, a channel through which cooling water can be circulated is formed in the induction coil (for instance, water-cooling type cupper tube).

In any case, the number of winding layers of induction coils for forming the upper or lower layers may be more than two so at to generate further strengthened alternating magnetic flux.

Said magnetic cores are made of laminated metal core or ferrite core. Advantages of employing magnetic core are three fold. Firstly, it enhances the strength of magnetic field substantially with low induction power. Secondly, it makes the distribution of magnetic flux more uniform. Thirdly, it makes the flux distribution to be concentrated on the region of semiconductor films, which leads to more efficient heat-treatment and to prevention of undesired interference by the magnetic flux on the conducting components installed around them (for instance, chamber wall or external heater block).

One of examples for further efficiently showing these advantages is that the magnetic cores are configured to simultaneously cover the external surface and central portion of induction coil wound in the planar form to form the upper and lower layers. That is, at the cross sectional view perpendicular to the induction coil, two "E"-type magnetic cores face each other on the imaginary central plane. Therefore, the outside part of the magnetic core covers the external surface of wound induction coil and the inside part of the magnetic core is inserted in the central portion of wound induction coil. In this configuration, the strongest alternating magnetic field is generated from the inside part of the magnetic core. While the heat-treatment materials move into the space formed by the upper and lower layers, in particular, between the two inside parts of the symmetrical magnetic cores, they can be induction-heated continuously and efficiently.

The length of gap between the upper and lower magnetic cores is not specially limited; however, if possible, it is desirable to narrow the length of gap for generation of the strong electromagnetic field. For example, the gap between the two magnetic cores may be designed to become less than the wide of the magnetic cores.

Said preheating members heat the semiconductor films to the extent that the thermally susceptible non-conducting substrates are not damaged and thus the semiconductor films can be induction-heated by the alternating magnetic flux from the induction coils. Generally, it has been understood that the induction heat used in the heat-treatment of conductive materials cannot be applied to the heat-treatment of semiconducting materials, because the latter requires the very strong induction power. However, the present inventors found that, when being heated to the specific temperature, even materials such as semiconductor films can be induction-heated with the small induction power, which is not a generally accepted idea. Accordingly, said preheating members make the semiconductor films acceptable to the condition for induction heating. According to the present invention, the preheating members heat the semiconductor films prior to its movement into the space, formed by the upper and lower layers of induction coil and the magnetic cores covering them, in which the high collimated alternating magnetic field is applied. Such preheating members ultimately heat the semiconductor films, and the type of preheating members may be manifold as the below.

In the first exemplary type, resistance heating sources are used to uniformly heat the atmosphere around the heat-treatment materials, which can minimize damage of the substrates by heating them wholly.

In the second exemplary type, heating plates are used being made of materials with a high resistance and good heat conductivity and being an electrically nonconductive such as AlN (Aluminum Nitride) or BN (Boron Nitride), in which the heat-treatment materials put on the heating plates are heated by the conduction heat from the heating plates In the third exemplary type, heating plates are used being made of metal or graphite with a high conductivity, in which the heating plates are heated by the induction-heating from induction coils installed above, below or side the heating plates. That is, the heating plates are heated under the alternating magnetic field through a heating mechanism of eddy currents (i.e., induction heating), and then the heat-treatment materials are heated by the conduction heat from the heating plates.

Although the three types have been proposed as above, other types may be possible if they heat the semiconductor films to the specific temperature for preparation of induction-heating.

The upper limit of temperature in the preheating members should be kept lower than the distortion temperature of the thermally susceptible substrates; for example, in the case of glass, the temperature of the preheating members should be kept lower than about 600° C. being the distortion temperature of glass. Meanwhile, the lower limit of temperature in the preheating members is not specifically limited, since the induction-heating become possible even at the low temperature when a strong high frequency current is applied. However, the application of the strong high frequency current requires enormous energy and the cost for making induction coils providing a very high induction magnetic field becomes very high, which is not desirable. Therefore, the temperature of the preheating members according to the present invention should be kept higher than about 200° C., preferably 400° C. For example, in the case that the semiconductor films on the non-conducting substrates are silicon films on glass substrates, the heating temperature of the preheating members is in the range of 200~600° C., preferably 400~600° C.

The apparatuses according to the present invention remarkably enhance the kinetics of crystallization of amorphous silicon, the solid phase crystallization (SPC) and the metal-induced crystallization (MIC). The apparatuses also remarkably enhance the kinetics of dopant activation of ion-implanted polycrystalline silicon.

The possible reason for the apparatuses according to the present invention to enhance the kinetics of said heat-treatment effects may be expressed as below. For simplicity, the semiconductor films are restricted to the silicon films and the thermally susceptible non-conducting substrates are restricted to the glass substrates, respectively.

Induction of alternating magnetic field inside the silicon films leads to generation of electromagnetic force (emf). Given assumption that the emf in the silicon films is the driving force for the kinetic enhancement, the Faraday's Law (also see B. D. Cullity, "Introduction of Magnetic Materials" (Addison Wesley, Mass., 1972), P. 36 incorporated herein by reference) defines the strength of emf as follows:

$$EMF = 10^{-8} N d\Phi/dt \text{ volts}$$

(Where N is the number of turns in the coil and $d\Phi/dt$ is the rate of change of magnetic flux in the maxwell/sec unit.) Accordingly, the increase of kinetics depends on both the strength of magnetic flux and the alternating frequency. The alternating frequency is in the range of 1 kHz~10 MHz. When the alternating frequency is less than 1 kHz, the electromagnetic force becomes small, whereby it is difficult to lead the crystallization. When the alternating frequency is more than 10 MHz, it is difficult to make the induction coils and magnetic cores for generating the alternating magnetic field of large scale. The above range of alternating frequency may be changed more or less depending on the configuration of induction coils.

Even though mechanism for generation of emf to enhance the heat-treatment effects is not understood, a couple of reasons can be speculated.

First mechanism is a selective joule heating of silicon films. Amorphous or polycrystalline silicon has high resistivity values at room temperature, for instance, $10^6$~$10^{10}$ $\Omega$-cm in the case of amorphous silicon. Thus, unless silicon is intentionally heated by external heat source, joule heating of silicon though said emf does not occur. However, when amorphous and polycrystalline Si are heated to elevated temperatures, their resistivities go down rapidly to the low values, for instance, 10~0.01 $\Omega$-cm at 500° C. Those resistivity values are similar to those of graphite (1~0.001 $\Omega$-cm) and thus the induction-heating becomes possible. In spite of local heating of amorphous silicon under alternating magnetic flux, the glass substrate having high resistivity values (~$10^{16}$ $\Omega$-cm) is not heated by said alternating magnetic flux. Thus, the glass remains to be at low temperatures pre-set by the external heating.

Second mechanism is that said emf activates the movement of silicon atoms through a field effect functioning on the charged defects. It is known that point defects such as vacancies, interstitial atoms and impurities are electrically charged (negatively or positively) in the silicon atomic structure. Motion of those charged defects are significantly enhanced by the presence of electric field, which has been commonly reported in the academic publications (e.g., "Field-Enhanced Diffusion" in silicon, see S. M. Sze "VLSI Technology" ($2^{nd}$ ed. McGraw Hill, 1988), P. 287 incorporated herein by reference).

It is to be understood that both the foregoing general description and the following detailed description are exemplary and explanatory, and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate embodiments of the invention that together with the description serve to explain the principles of the invention.

DETAILED DESCRIPTION OF PREFERRED EMBODIMENT

Figure 1:
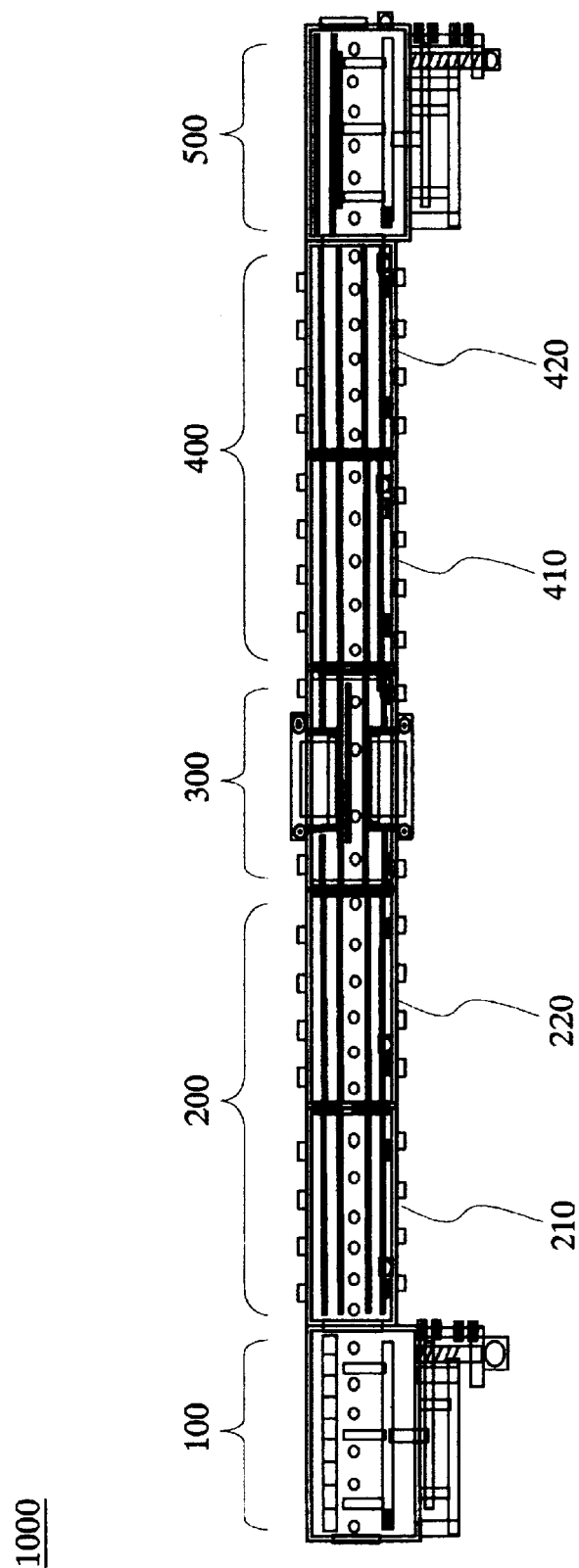
FIG. 1 is a schematic view of a low-temperature heat-treatment system including the low-temperature heat-treatment apparatus according to the present invention.

Referring to FIG. 1, a low-temperature heat-treatment system 1000 which includes a low-temperature heat-treatment apparatus according to the present invention consists of a supply member 100, a preheating member 200, an induction heating member 300, a cooling member 400, and a manufacture member 500, which are connected in serial for the continuous process. Each of the preheating member 200 and cooling member 400 has two chambers (210, 220, 410, 420) for consecutive heating and cooling of heat-treatment materials. The sudden change of temperature may lead damage of thermally susceptible non-conducting substrates, which is not desirable.

Figure 2A:
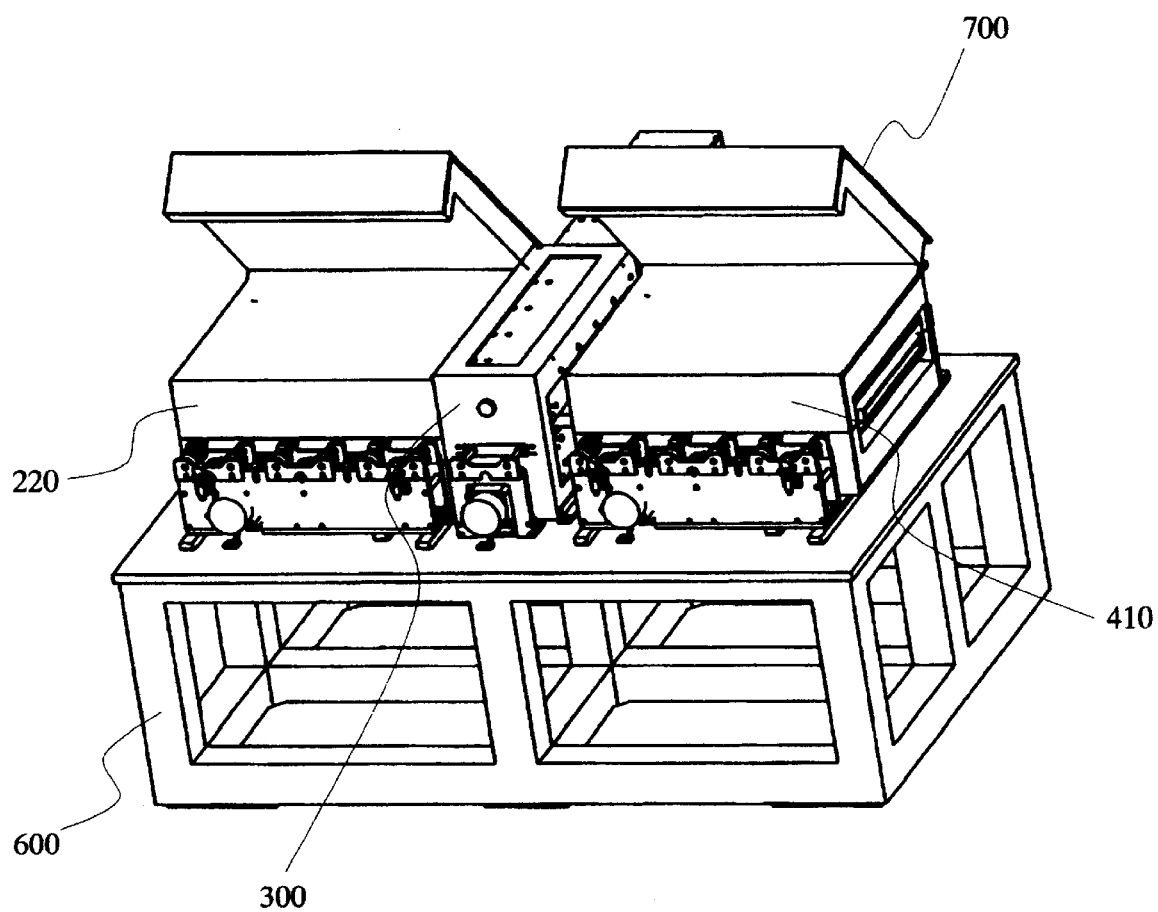
FIGS. 2A and 2B are perspective and planar views of a second preheating chamber, an induction-heating apparatus and a first cooling chamber according to the present invention.
Figure 2B:
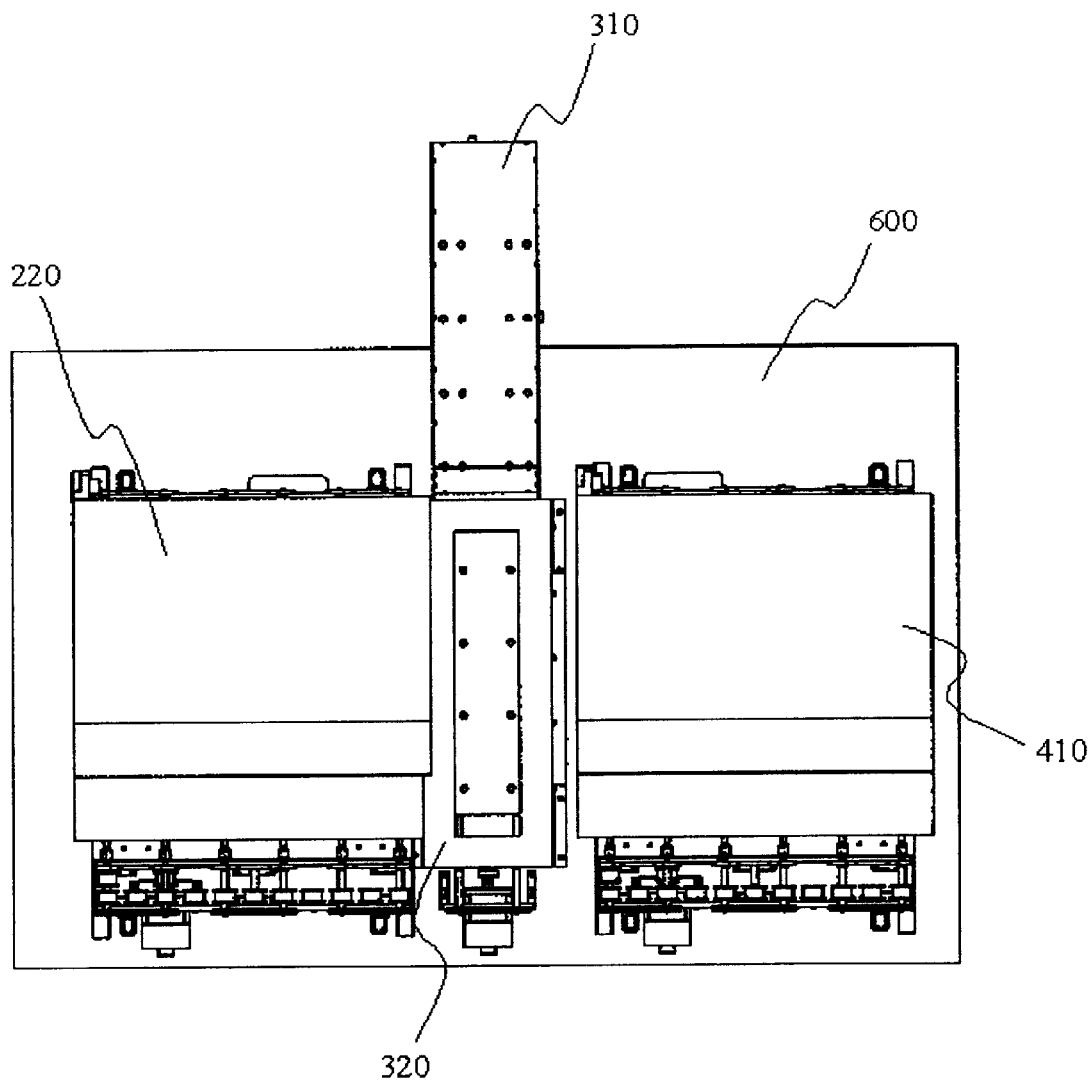

Referring to FIGS. 2A and 2B, a second preheating chamber 220, an induction-heating member 300 and a first cooling chamber 410 are mounted in serial on a table 600 for minimizing the external effect. Also, they have closing covers 700 for the facilitation of disorder check and exchange of components during the operation. In particular, the induction-heating member 300 consists of a main body 310 and a fixing body 320 in which the fixing body 320 can be assembled into the main body 310.

Figure 3:
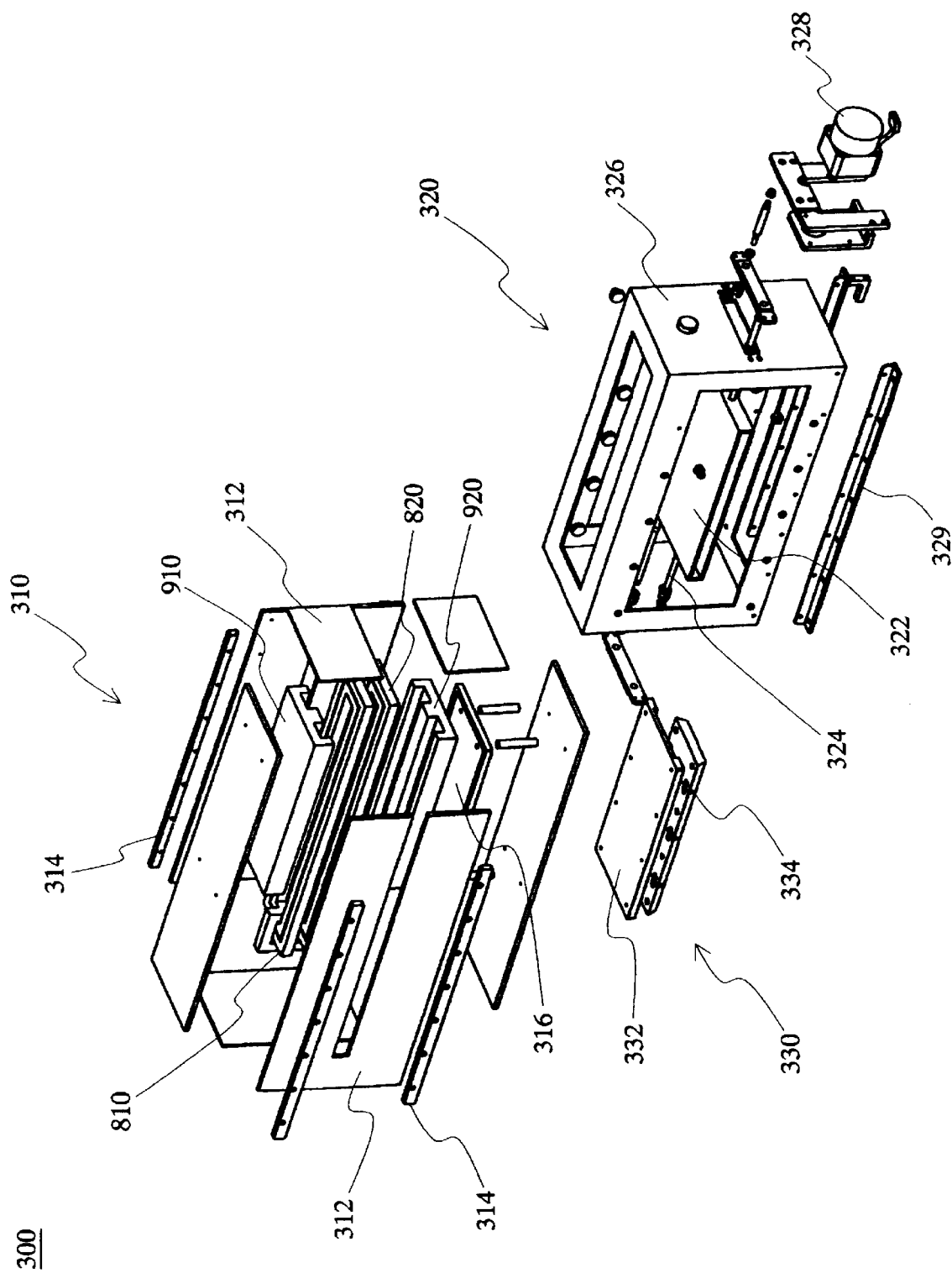
FIG. 3 is a disassembled-perspective view of a preferred embodiment of induction-heating apparatus according to the present invention.

Referring to FIG. 3, constitutional components of the induction-heating member 300 are shown in the state of disassembly. A fixing body 320 can be assembled and also disassembled into a main body 310 by a feed part 330. In the main body 310, induction coils 810, 820 and magnetic cores 910, 920 are installed. The main body 310 is covered with high frequency-shielding plates 312 made of metal such as aluminum to shield the high frequency magnetic field from the induction coils 810, 820. Each of high frequency-shielding plates 312 can be assembled with jointing parts 314 and thereby also being easily disassembled. The induction coils 810, 820 and magnetic cores 910, 920 are supported by props 316. The induction coils 810, 820 are connected a power supply (not shown in the figure) of supplying the high frequency current and cooling water.

In the fixing body 320, a substrate-transfer tube 322 is connected to a box 326 through rollers 324. The substrate-transfer tube 322 becomes located inside the space between an upper layer induction coil 810 and a lower layer induction coil 820 in the assembled state of the main body 310 and the fixing body 320. The substrate-transfer tube 322 and rollers 324 which are affected by the induction magnetic field from the induction coils 810, 820 are made of materials allowing the passage of alternating magnetic field but not the generation of induction-heating, preferably quartz. Meanwhile, the box 326 is not necessary to be made of the above materials such as quartz, because the alternating magnetic field from the induction coils 810, 820 is concentrated onto the substrate-transfer tube 322 by the magnetic cores 910, 920. A driving motor 328 installed on the lateral face of the box 326 makes heat-treatment materials (not shown in the figure) move inside the substrate-transfer tube 322. The box 326 is installed on the table 600 (refer to FIG. 2A) by joint parts 329. The main body 310 is connected to a moving part 332 and moves on a static part 334 connected to the fixing body 320.

Referring to FIGS. 4A~4D through FIGS. 6A~6D, shown are exemplary configurations of induction coils and magnetic cores according to preferable embodiments of the present invention.

Figure 4A:
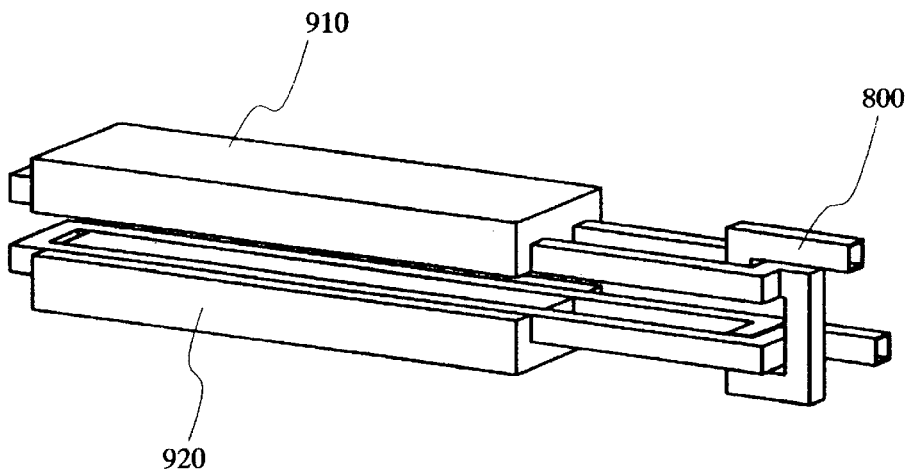
FIGS. 4A~4D are perspective, planar and lateral views in the assembled and disassembled forms of a preferred embodiment of an induction coil and its corresponding magnetic cores according to the present invention.
Figure 4B:
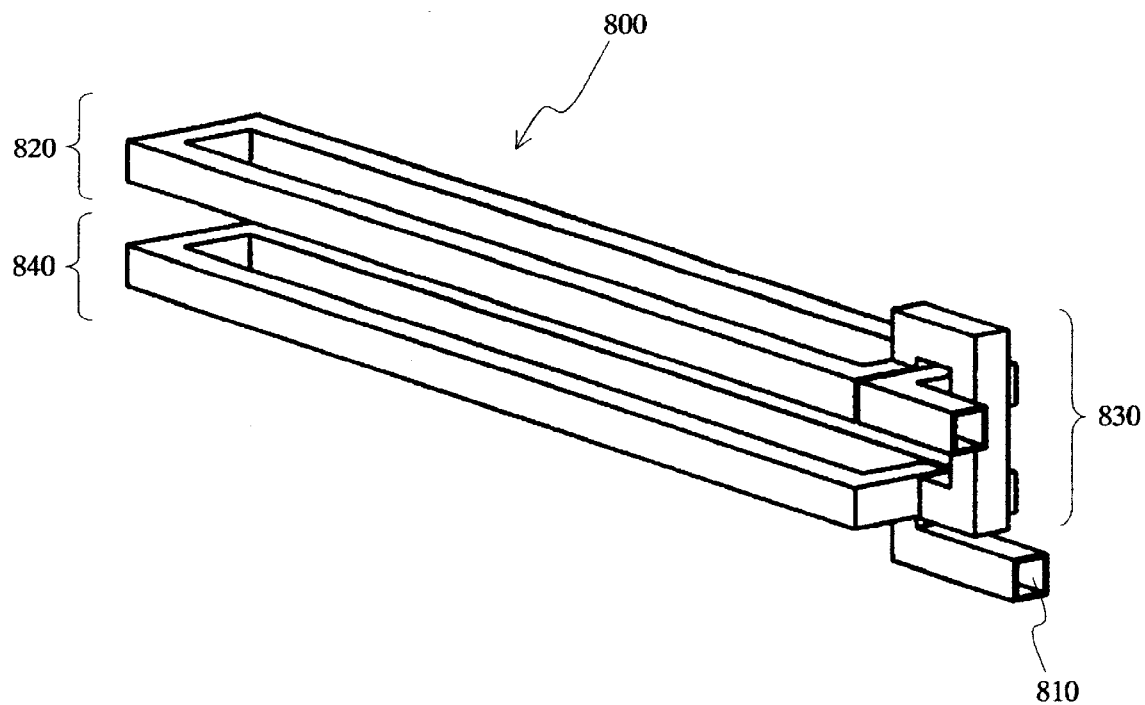
Figure 4C:
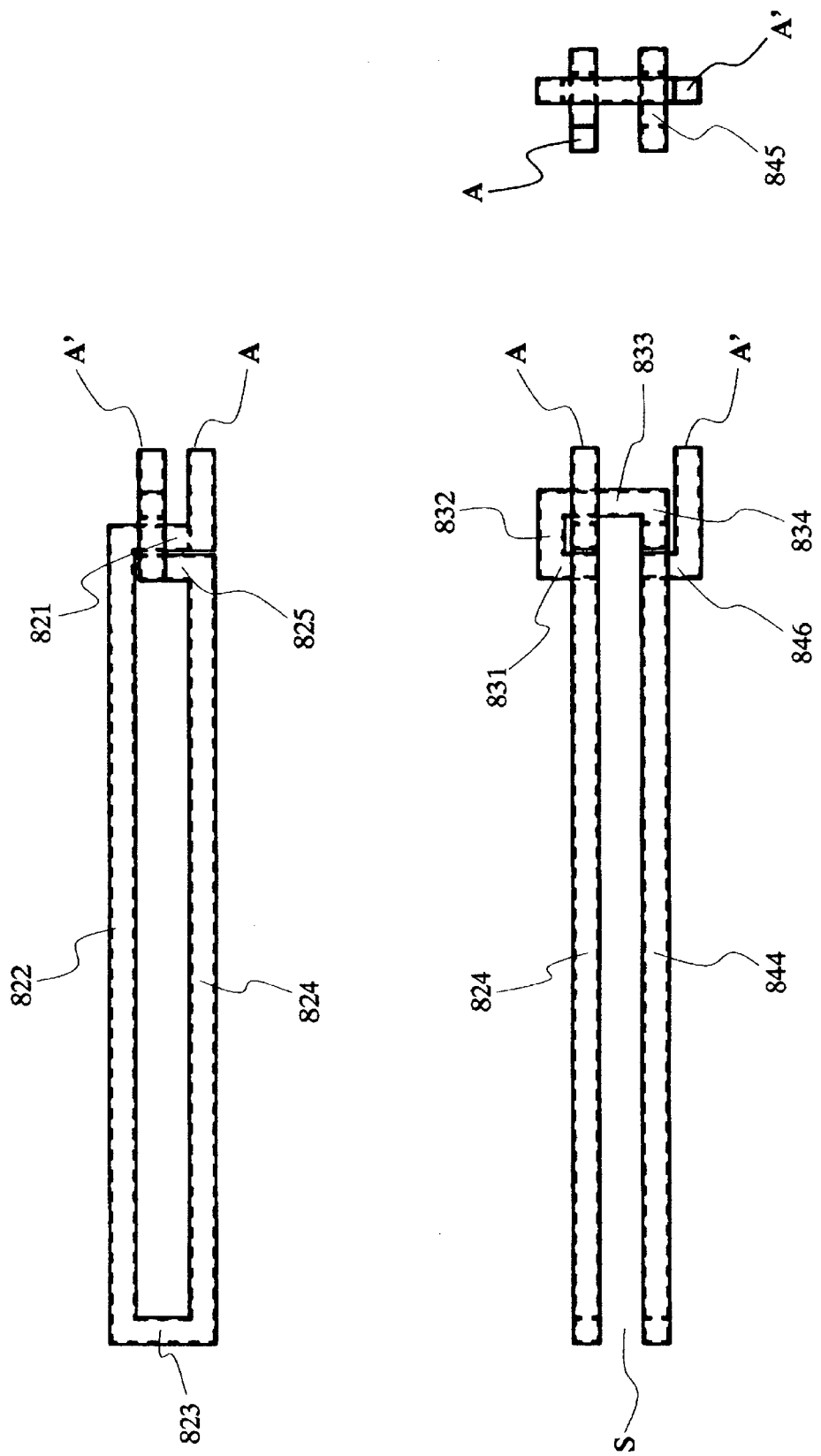
Figure 4D:
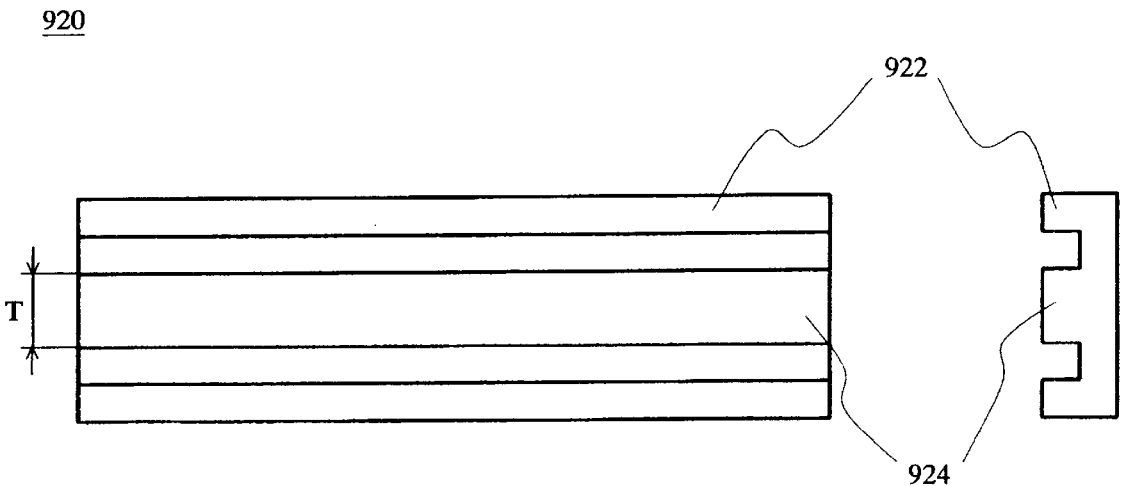

Referring to FIGS. 4A~4D, FIG. 4A shows in a perspective view the assembled state of configuration wherein an induction coil 800 with the square cross-section is wound as one round. FIG. 4B shows only the induction coil 800 in a perspective view and FIG. 4C shows it in planar, front and lateral views, respectively. is FIG. 4D shows corresponding magnetic cores 900 in planar and lateral views.

The induction coil 800 has a channel 810 for circulation of cooling water to prevent the induction coil 800 from being overheated. The induction coil 800 starting at the upper end (A) forms an upper layer 820 and lower layer 840 and then ends at the lower end (A'), wherein the upper end (A') is located at the same direction with the lower end (A). The induction coil 800 should not be contacted itself during the winding procedure for formation of upper layer 820 and lower layer 840.

Concerning such winding procedure, FIG. 4C can be referred to. The induction coil 800 starting at the upper end (A) is counterclockwise wound through portions 821, 822, 823, 824, 825 as one round with being kept planar to form an upper layer 840. Then, the induction coil 800 is protruded upward from portion 825 and rotated through portions 831, 832, 833, 834 on the vertical plane without being contacted itself. And, the induction coil 800 is wound in the same winding round and direction with the upper layer 820 to form a lower layer 840. Then, the induction coil 800 is protruded downward from the plane of portions 844, 845 and finally arrives at the lower end (A'). Accordingly, at the view of whole configuration, the separate space (S) is formed between the upper layer 820 and lower layer 840, and at the direction to the upper and lower ends (A, A'), both layers are connected through the lateral portion 830 (refer to FIG. 4B), but at the opposite direction, both layers are separated.

Turning to FIG. 4A, magnetic cores 900 corresponding to the induction coil 800 consist of an upper magnetic core 910 and lower magnetic core 920 covering each external surface of the upper layer 820 and lower layer 840. FIG. 4D shows planar and lateral views of the lower magnetic core 920, wherein the outside part 922 covers the external surface of the induction coil 800 and the inside part 924 is inserted between the central portion of the induction coil 800. As will be certified in FIGS. 7A and 7B, the inside part 920 provides the most strong and collimated alternating magnetic flux and hence generating the high electromagnetic force onto heat-treatment materials. In order to enforce such effect, according to one of features of the present invention, the width (T) of the inside part 924 is designed to be larger than the width of the space (S) between the upper layer 820 and lower layer 840 of induction coil 800.

Figure 5A:
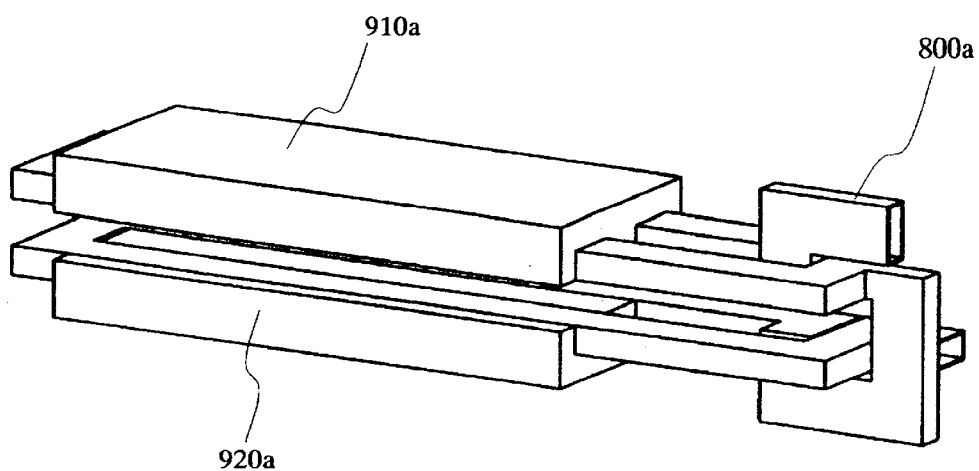
FIGS. 5A~5D are perspective, planar and lateral views in the assembled and disassembled forms of other preferred embodiment of an induction coil and its corresponding magnetic cores according to the present invention.
Figure 5B:
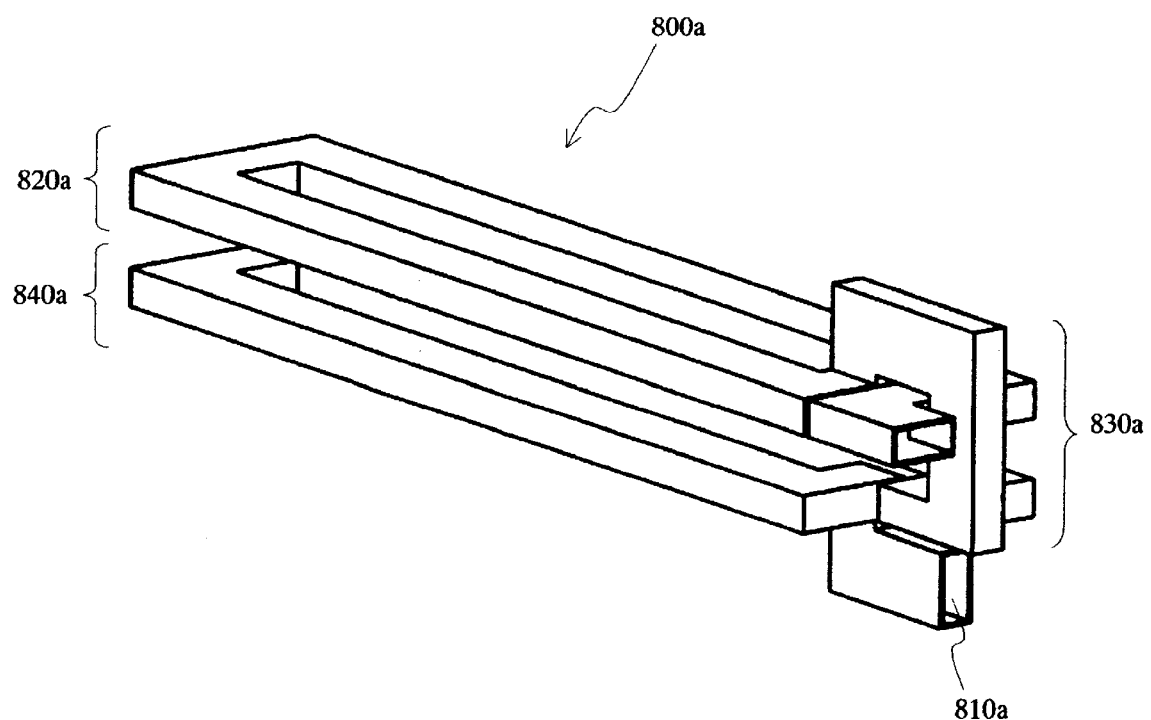
Figure 5C:
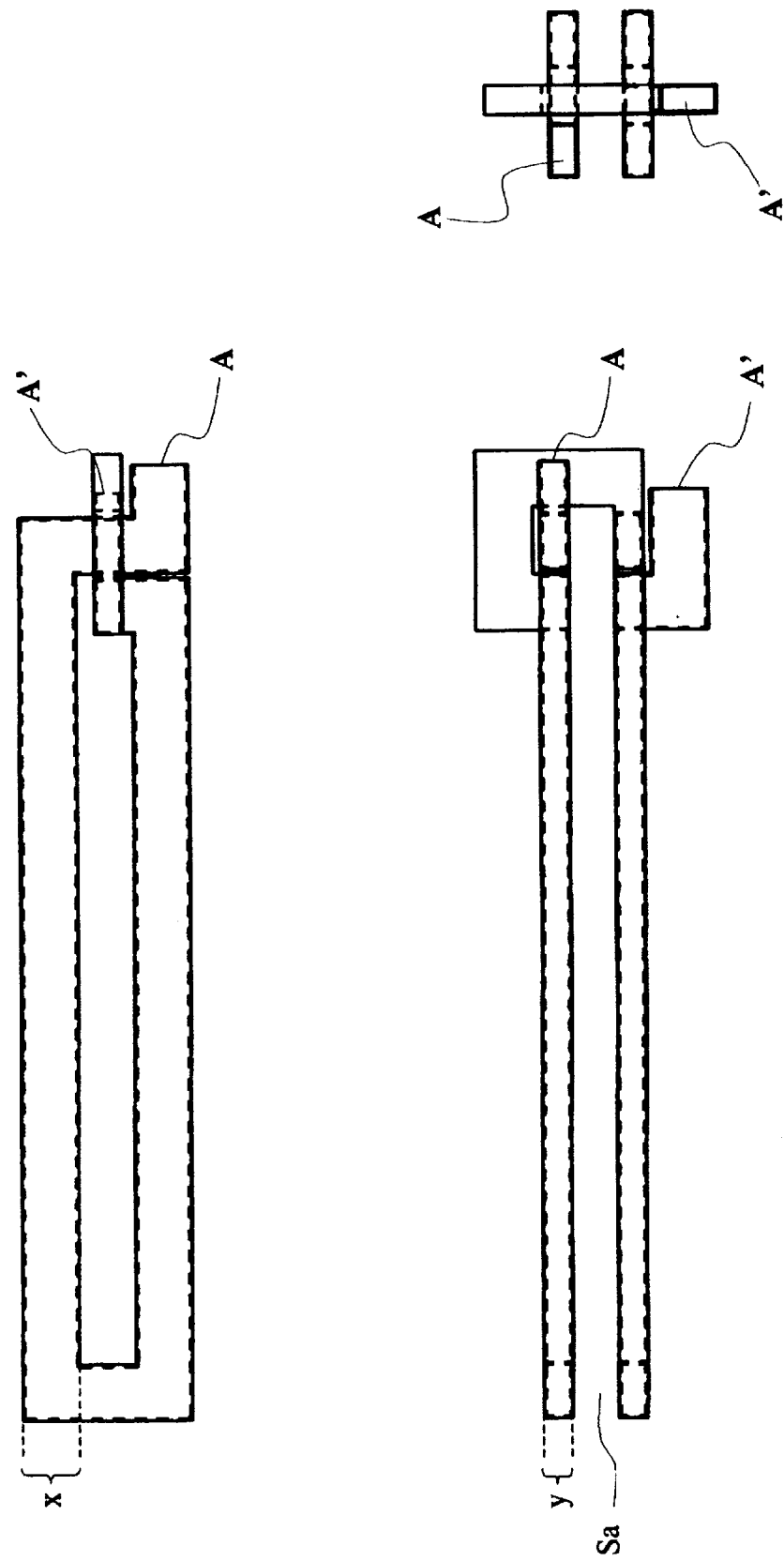
Figure 5D:
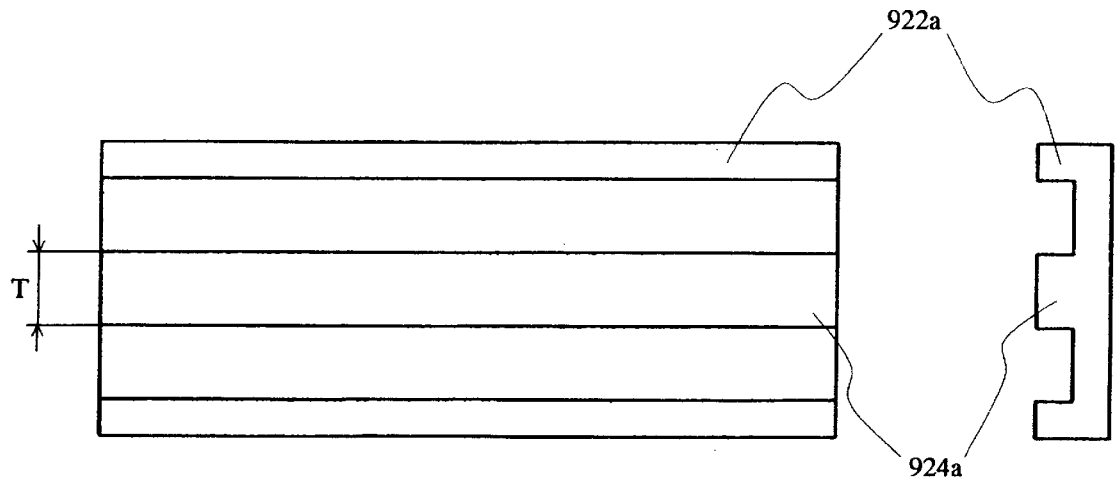

Referring to FIGS. 5A~5D, an induction coil 800a with the rectangular cross section 810a is disclosed which is designed in the same way with the winding method and round of the induction coil 800 shown in FIGS. 4A~4D, and its corresponding magnetic cores 910a, 920a are also disclosed. Since the winding method of the induction coil 800a is the same that of the induction coil 800, the explanation thereon is omitted. In the induction coil 800a, the wide portion (x) faces the space (Sa) between the upper layer 820a and lower layer 840a at the cross-sectional view and thus the further strong alternating magnetic field is applied to the heat-treatment materials. However, the narrow portion (y) dose not restrict the width of the space (Sa) between the upper layer 820a and lower layer 840a. Concerning the configuration of magnetic core corresponding to the above induction coil 800a, FIG. 5D shows the fact that the size of groove is larger than that in FIG. 4D because of the wide portion (x) of induction coil 800a. For this reason, the magnetic fluxes generated from the inside part of upper magnetic core 910a are introduced to the inside part 924a of lower magnetic core 920a with minimizing leakage to outside part 922a.

Figure 6A:
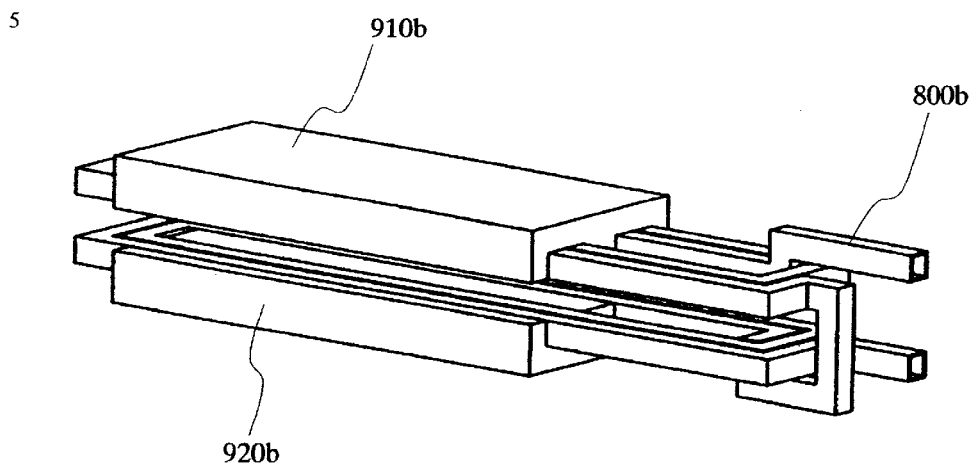
FIGS. 6A~6D are perspective, planar, lateral and bottom views in the assembled and disassembled forms of another preferred embodiment of an induction coil and its corresponding magnetic cores according to the present invention.
Figure 6B:
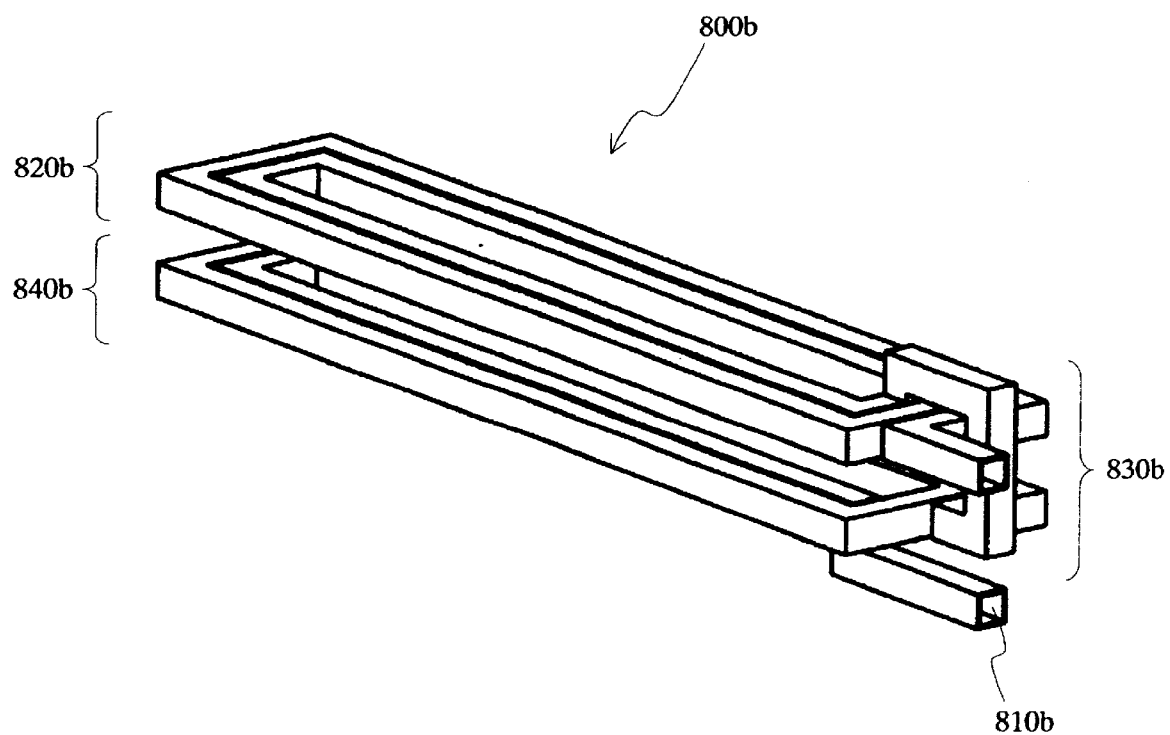
Figure 6C:
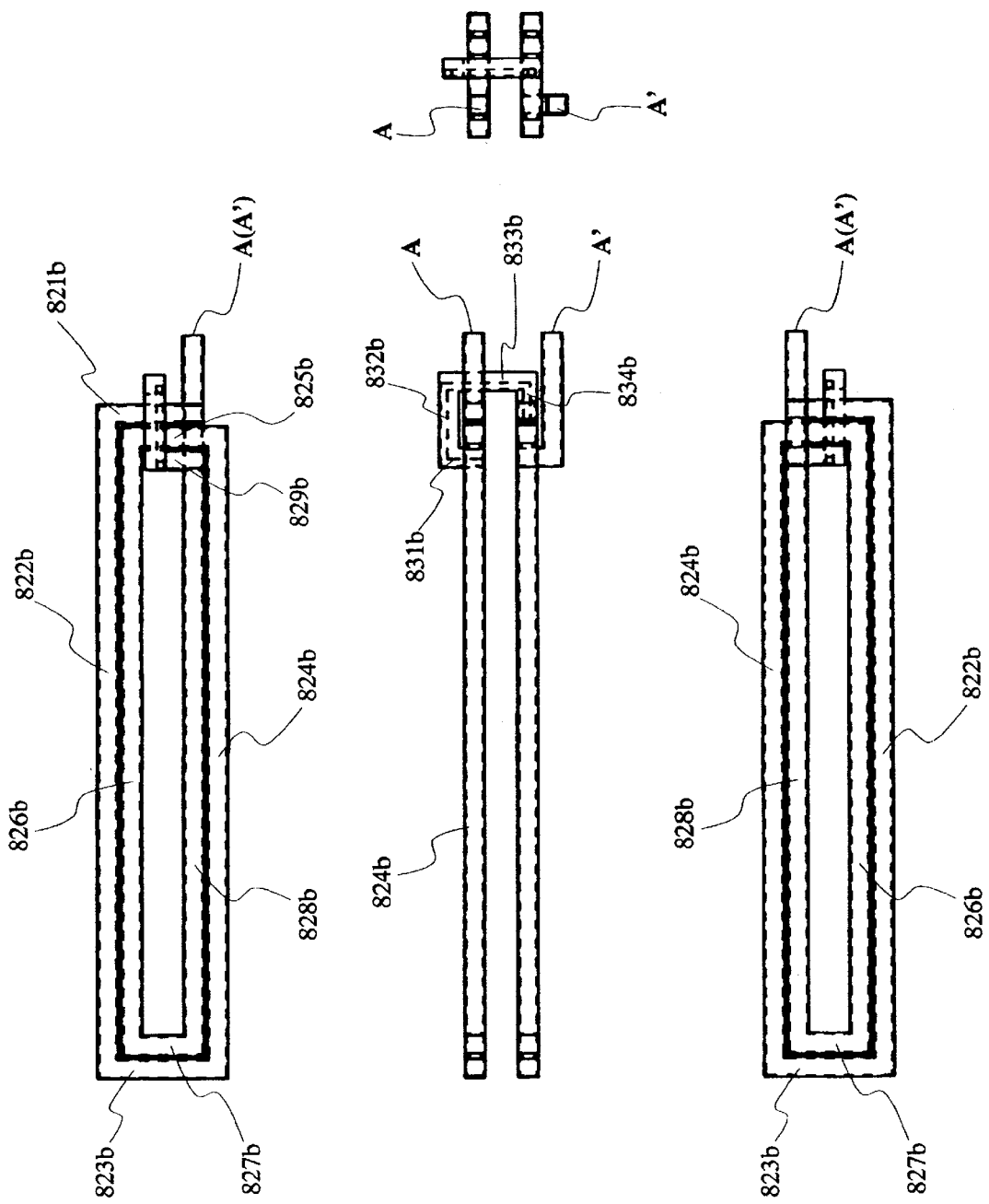

Referring to FIGS. 6A~6D, an induction coil 800b with the square cross-section 810b is disclosed being wound by two rounds in the planar state. For clear expression on the winding method, FIG. 6C shows plane, front, bottom and lateral views of an induction coil 800b.

The induction coil 800b starting at the upper end (A) is counterclockwise wound through portions 821b, 822b, 823b, 824b, 825b with being kept planar as the first round and subsequently counterclockwise wound through portions 826b, 827b, 828b, 829b inside the first round with being kept planar as the second round to form an upper layer 840b. Then, the induction coil 800b is protruded upward from portion 829 and rotated through portions 831b, 832b, 833b, 834b on the vertical plane without being contacted itself. And, the induction coil 800b is wound at the same winding direction and round with the upper layer 820b to form a lower layer 840b and finally arrives at the lower end (A').

Figure 6D:
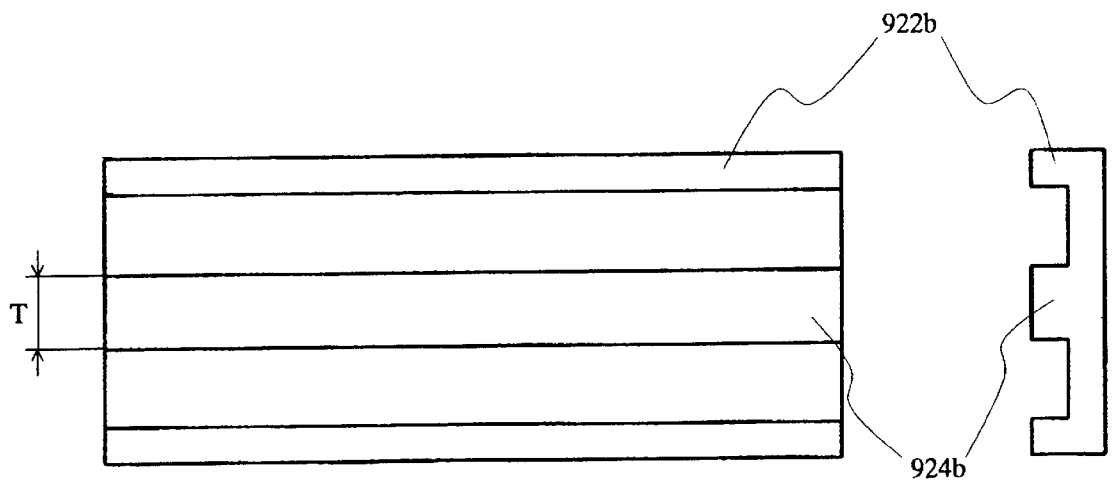

Referring to FIG. 6D, disclosed is one of magnetic cores to be assembled to the induction coil 800b wound as two rounds. As can be seen from FIG. 6D, the magnetic core is not inserted between the first round and the second round of induction coil 800b.

The above configurations are merely exemplary and various modifications may be designed within the scope of the present invention.

Figure 7A:
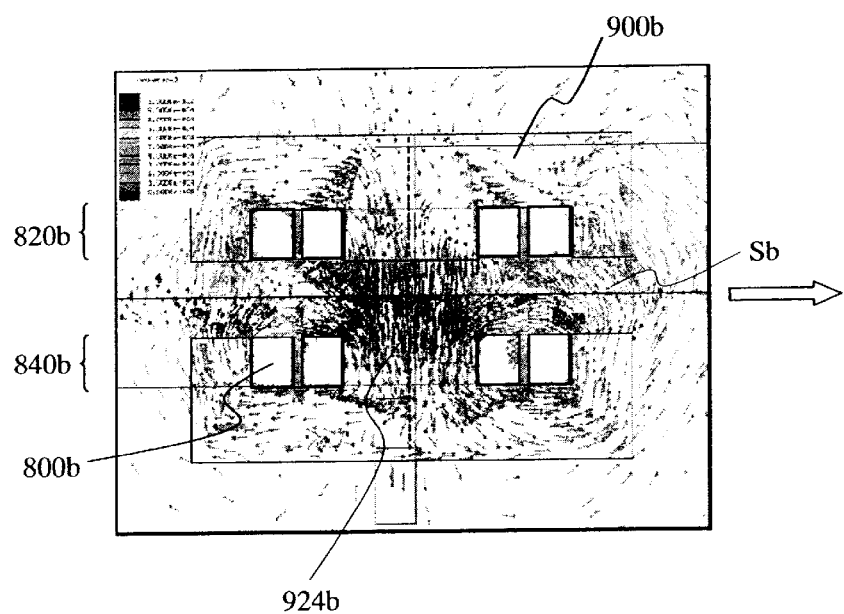
FIGS. 7A and 7B are simulation figures regarding the distribution and strength of magnetic flux from the induction coils and magnetic cores of FIG. 6A.
Figure 7B:
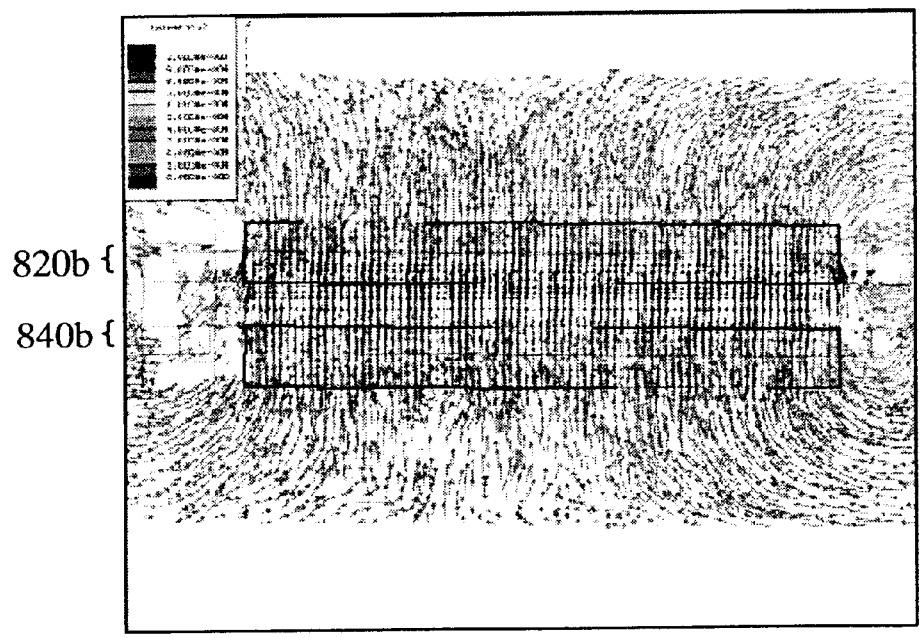

FIGS. 7A and 7B shows the result of the simulation experiment using the apparatus comprising the induction coil 800b and magnetic cores 900b of FIG. 6A. The simulation experiment was for seeing the distribution and strength of induction magnetic fluxes.

Condition of Simulation material/width/length of magnetic core: iron powder/160 mm /400 mm winding round of induction coil: two rounds gap of upper and lower magnetic cores: 30 mm applied current: 100 A frequency: 450 kHz Referring to FIGS. 7A and 7B, magnetic fluxes (arrows) generated by the induction coil 800b are concentrated between the upper layer 820b and lower layer 840b by the magnetic core. The magnetic fluxes are vertically applied onto the heat-treatment materials being placed in the space (Sb) between both layers 820b, 840b and thereby generating the electromagnetic force parallel to the semiconductor films. As seen from the figures, the magnetic fluxes generate the highest density and strongest electromagnetic force at the inside part 924b of magnetic core 920b. The heat-treatment materials pass through the inside part 824b by moving to the direction shown in FIG. 7A.

Additional Applications of Present Invention

It should be understood that application of the apparatuses claimed in the present invention is not limited to the specific objectives described in the present invention (i.e., crystallization of amorphous silicon and dopant activation). As more specific examples, the apparatuses according to the present invention can be used in the low-temperature heat-treatment of indium-tin-oxides (ITO) or metal films on a glass (or plastic) in the display, microelectronics, and solar cell industries. It is also thought that the same means can be used in a number of other processes wherein heat-treatments of conductor or semi-conductor films upon thermally susceptible non-conducting substrates (typically glass or plastics) at a minimum thermal budget are required.

The invention being thus described, it will be obvious that it is susceptible to obvious modifications and variations. Such variations are not to be regarded as a departure from the spirit and scope of the invention, and all such modifications as would be obvious to one skilled in the art were intended to be included within the scope of the following claims.

What is claimed is:

1. Apparatuses for low-temperature heat-treatment of semiconductor films upon thermally susceptible non-conducting substrates comprises:
   (a) induction coils continuously forming an upper layer and a lower layer in such a way that the electromagnetic force can be generated parallel to the in-plane direction of semiconductor films, wherein heat-treatment materials consisting of thermally susceptible non-conducting substrates and semiconductor films deposited thereon can be moved into the space between said upper layer and said lower layer;
   (b) magnetic cores covering the external surfaces of said upper layer and said lower layer, respectively; and,
   (c) preheating member heating the heat-treatment materials for preparation of induction-heat prior to its movement into the space between said upper layer and said lower layer, wherein the semiconductor films of the heat-treatment materials is heated to the extent that said semiconductor films can be induction-heated at the minimum thermal budget acceptable for the use of substrates.

2. The apparatuses of claim 1 wherein said semiconductor films are silicon films of the nature of amorphous silicon films or crystalline silicon films, said thermally susceptible non-conducting substrates being glass and plastic substrates.

3. The apparatuses of claim 2 wherein said silicon films are amorphous films deposited onto the glass for the purpose of crystallization, or polycrystalline films ion-implanted with a dopant such as n-type or p-type for the purpose of electrical activation.

4. The apparatuses of claim 1 wherein said induction coil starting at an upper end is wound in the planar form by one or more than two rounds and then turns back to that upper end to form said upper layer, and subsequently said induction coil starting at a lower end corresponding to the upper end is wound in the planar form by one or more than two rounds and then turns back to that lower end to form said lower layer.

5. The apparatuses of claim 4 wherein the number of winding layers of induction coils for forming said upper or lower layers is more than two so at to generate further strengthened alternating magnetic flux.

6. The apparatuses of claim 1 wherein said magnetic cores are made of laminated metal core or ferrite core and configured to simultaneously cover the external surface and central portion of induction coil wound in the planar form to form the upper and lower layers.

7. The apparatuses of claim 1 wherein the heating temperature of said preheating members is in the range of 200~600° C.

8. The apparatuses of claim 1 wherein, for said preheating member, resistance heating sources are used to uniformly heat the atmosphere around the heat-treatment materials, which can minimize damage of the substrates by heating them wholly.

9. The apparatuses of claim 1 wherein, for said preheating member, heating plates are used being made of materials with a high resistance and good heat conductivity and being an electrically non-conductive such as Aluminum Nitride or Boron Nitride, in which the heat-treatment materials put on the heating plates are heated by the conduction heat from the heating plates.

10. The apparatuses of claim 1 wherein, for said preheating member, heating plates are used being made of metal or graphite with a high conductivity, in which the heating plates are heated by the induction-heating from induction coils installed above, below or side the heating plates and the heat-treatment materials are heated by the conduction heat from the heating plates.

11. The apparatuses of claim 1 wherein said heat-treatment is for solid phase crystallization, metal-induced crystallization or metal-induced lateral crystallization of amorphous silicon, or dopant activation of ion-implanted polycrystalline silicon.

* * * * *